(12) United States Patent
Lee et al.

(10) Patent No.: US 12,147,784 B2
(45) Date of Patent: Nov. 19, 2024

(54) COMPUTE IN MEMORY

(71) Applicant: Taiwan Semiconductor Manufacturing Company, Ltd., Hsinchu (TW)

(72) Inventors: Po-Hao Lee, Hsinchu (TW); Chia-Fu Lee, Hsinchu (TW); Yi-Chun Shih, Taipei (TW); Yu-Der Chih, Hsin-Chu (TW); Hidehiro Fujiwara, Hsin-Chu (TW); Haruki Mori, Hsinchu (TW); Wei-Chang Zhao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 492 days.

(21) Appl. No.: 17/387,598

(22) Filed: Jul. 28, 2021

(65) Prior Publication Data

US 2022/0244916 A1 Aug. 4, 2022

Related U.S. Application Data

(60) Provisional application No. 63/143,467, filed on Jan. 29, 2021.

(51) Int. Cl.
*G06F 7/544* (2006.01)
*G11C 11/412* (2006.01)

(52) U.S. Cl.
CPC .......... *G06F 7/5443* (2013.01); *G11C 11/412* (2013.01)

(58) Field of Classification Search
CPC ....................................................... G06N 3/063
See application file for complete search history.

(56) References Cited

U.S. PATENT DOCUMENTS

| 10,748,603 | B2* | 8/2020 | Sumbul .................. G06N 3/065 |
| 2005/0024940 | A1* | 2/2005 | Kato ...................... G11C 11/419 |
| | | | 365/185.17 |
| 2019/0370640 | A1* | 12/2019 | Peng ...................... G11C 11/413 |
| 2019/0392287 | A1* | 12/2019 | Ovsiannikov ............ G06N 3/04 |
| 2020/0012936 | A1* | 1/2020 | Lee .......................... G06N 3/08 |
| 2020/0026498 | A1 | 1/2020 | Sumbul et al. |
| 2021/0263672 | A1* | 8/2021 | Chang ................... G06F 3/0673 |

(Continued)

FOREIGN PATENT DOCUMENTS

| CN | 110010176 A | 7/2019 |
| TW | 202013213 A | 4/2020 |

*Primary Examiner* — Douglas King
(74) *Attorney, Agent, or Firm* — MERCHANT & GOULD P.C.

(57) ABSTRACT

A compute-in-memory (CIM) device has a memory array with a plurality of memory cells arranged in rows and columns. The plurality of memory cells includes a first memory cell in a first row and a first column of the memory array and a second memory cell in the first row and a second column of the memory array. The first and second memory cells are configured to store respective first and second weight signals. An input driver provides a plurality of input signals. A first logic circuit is coupled to the first memory cell to provide a first output signal based on a first input signal from the input driver and the first weight signal. A second logic circuit is coupled to the second memory cell to provide a second output signal based on a second input signal from the input driver and the second weight signal.

20 Claims, 19 Drawing Sheets

(56) References Cited

U.S. PATENT DOCUMENTS

2021/0279036 A1* 9/2021 Li .......................... H04N 19/42
2022/0207334 A1* 6/2022 Lee ....................... G06N 3/063
2022/0269483 A1* 8/2022 Lo ......................... G11C 11/54
2022/0366968 A1* 11/2022 Liu ..................... G11C 11/4094

* cited by examiner

| A B Ci | SUM | |
|---|---|---|
| | SIGN = 0 | SIGN = 1 |
| 000 | 0 | 0 |
| 001 | 1 | 0 |
| 010 | 0 | 1 |
| 011 | 1 | 0 |
| 100 | 0 | 1 |
| 101 | 1 | 0 |
| 110 | 0 | 1 |
| 111 | 1 | 1 |

FIG. 16

COMPUTE IN MEMORY

CROSS-REFERENCE TO RELATED APPLICATION

This application claims the benefit of U.S. Provisional Patent Application No. 63/143,467, filed Jan. 29, 2021, the disclosure of which is hereby incorporated by reference in its entirety.

BACKGROUND

This disclosure relates generally to in-memory computing, or compute-in-memory ("CIM"), and further relates to memory arrays used in data processing, such as multiply-accumulate) operations. Compute-in-memory or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications. Efforts are ongoing to improve the performance of compute-in-memory systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 16 is a truth table for a full adder circuit in accordance with some embodiments.

DETAILED DESCRIPTION

Figure 1:
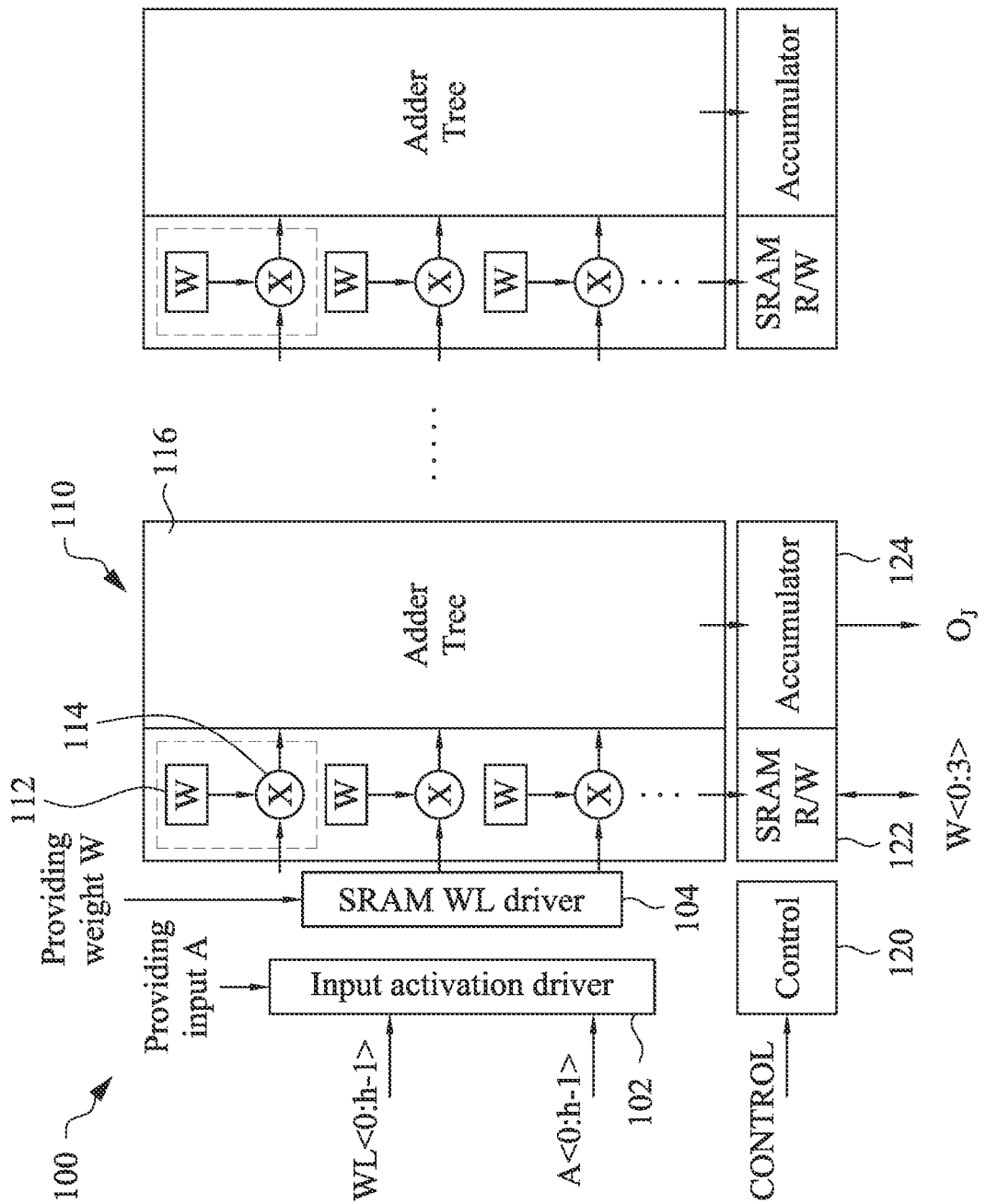
FIG. 1 is a block diagram illustrating an example of a compute-in-memory (CIM) device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure relates generally to computing-in-memory ("CIM"). An example of applications of CIM is multiply-accumulate ("MAC") operations. Computer artificial intelligence ("AI") uses deep learning techniques, where a computing system may be organized as a neural network. A neural network refers to a plurality of interconnected processing nodes that enable the analysis of data, for example. Neural networks compute "weights" to perform computation on new input data. Neural networks use multiple layers of computational nodes, where deeper layers perform computations based on results of computations performed by higher layers.

CIM circuits perform operations locally within a memory without having to send data to a host processor. This may reduce the amount of data transferred between memory and the host processor, thus enabling higher throughput and performance. The reduction in data movement also reduces energy consumption of overall data movement within the computing device.

In accordance with some disclosed embodiments, a CIM device includes a memory array with memory cells arranged in rows and columns. The memory cells are configured to store weight signals, and an input driver provides input signals. Each of the memory cells is coupled to a respective first logic circuit, such as a multiply circuit, which provides an output signal based on the input signal from the input driver and the weight signal stored in the corresponding memory cell. The outputs of the logic cells are accumulated, or added to obtain the system output value.

An example of the mathematical description of the MAC operation is shown below.

$$O_J = \Sigma_{J=}^{h-1}(A_I \times WIJ) \quad (1)$$

In equation (1) above, $A_I$ is the I-th input, WIJ is the weight corresponding to the I-th input and J-th weight column. $O_J$ is the MAC output of the J-th weight column, and h is the accumulated number.

FIG. 1 is a block diagram illustrating an example CIM device 100 in accordance with the present disclosure. A CIM memory array 110 includes a plurality of memory cells 112 configured to store weight signals W. CIM can be implemented with a variety of memory devices, including static random-access memory ("SRAM"). In a typical SRAM device, data are written to, and read from, an SRAM cell via one or more bitlines ("BLs") upon activation of one or more access transistors in the SRAM cell by enable-signals from one or more wordlines ("WLs").

Figure 2:
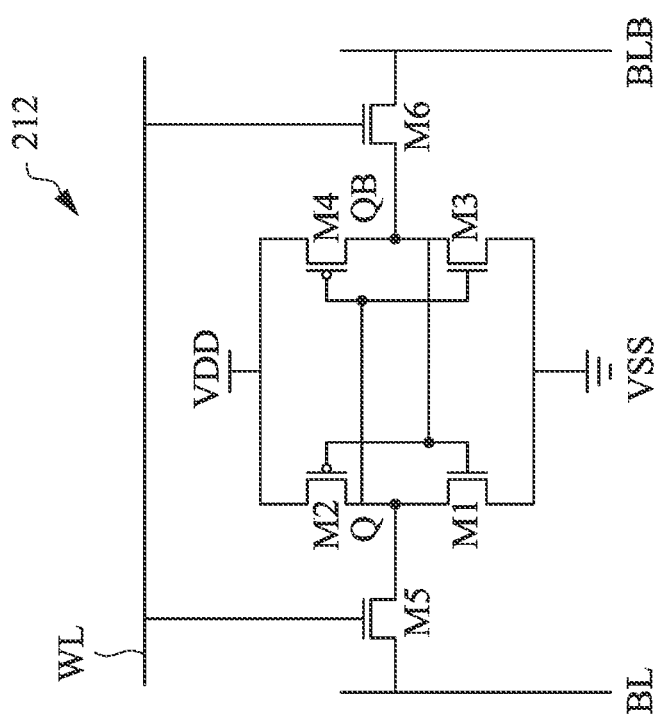
FIG. 2 is a schematic diagram illustrating an example of an SRAM memory cell used in the CIM device of FIG. 1 in accordance with some embodiments.

FIG. 2 is a circuit diagram illustrating an example memory cell 112 in accordance with some embodiments. The memory cell 112 includes but is not limited to a six-transistor (6T) SRAM cell 212. In some embodiments more or fewer than six transistors may be used to implement the SRAM cell 212. For example, the SRAM cell 212 in some embodiments may use a 4T, 8T or 10T SRAM structure, and in other embodiments may include a memory-like bit-cell or a building unit. The SRAM cell 212 includes a first inverter formed by a NMOS/PMOS transistor pair M1 and M2, and a second inverter formed by a NMOS/PMOS transistor pair M3 and M4, and access transistors/pass gates M5 and M6.

Power is supplied to each of the inverters, for example, a first terminal of each of transistors M2 and M4 is coupled to a power supply VDD, while a first terminal of each of transistors M1 and M3 is coupled to a reference Voltage VSS, for example, ground. A bit of data is stored in the SRAM cell 212 as a voltage level at the node Q, and can be read by circuitry via the bit line BL. Access to the node Q is controlled by the pass gate transistor M5. The node Qbar (QB) stores the complement to value at Q, e.g. if Q is "high," QB will be "low," and can be read by circuitry via the bit line BLbar (BLB). Access to QB is controlled by the pass gate transistor M6.

A gate of the pass gate transistor M5 is coupled to a word line WL. A first source/drain (S/D) terminal of the pass gate transistor M5 is coupled to the bit line BL, and a second S/D terminal of the pass gate transistor M5 is coupled to the second terminals of transistors M1 and M2 at the node Q. Similarly, a gate of the pass gate transistor M6 is coupled to the word line WL. A first S/D terminal of the pass gate transistor M6 is coupled to the complementary bit line BLB, and a second S/D terminal of the pass gate transistor M6 is coupled to second terminals of transistors M3 and M4 at the node QB.

Returning to FIG. 1, the CIM device 100 further includes an input driver 102 and a WL driver 104. The input driver 102 drives the input signals A to the logic circuits 114. The WL driver outputs WL signals to activate the desired rows i of memory array 110, thus providing the stored weight signals W to the logic circuits 114. A memory controller 120 receives control inputs, and provides control signals to an SRAM read/write circuit 122 connected to the bitlines BL, BLB of the memory array 110 so as to select the appropriate bitlines BL, BLB (i.e. columns) corresponding to the stored weight W. In the illustrated example a 4-bit weight W[0:3] is employed so four columns of memory cells 100 and logic circuits are used to store the various weight values. Thus, a weight value having w bits uses w columns of memory cells 100 and corresponding logic circuits. The output signals from the logic circuits 114 are provided to an adder circuit 116, which adds the outputs of the various logic circuits 114. An accumulator circuit is coupled to the adder circuit 116 and is configured to provide the MAC output $O_J$.

Figure 3:
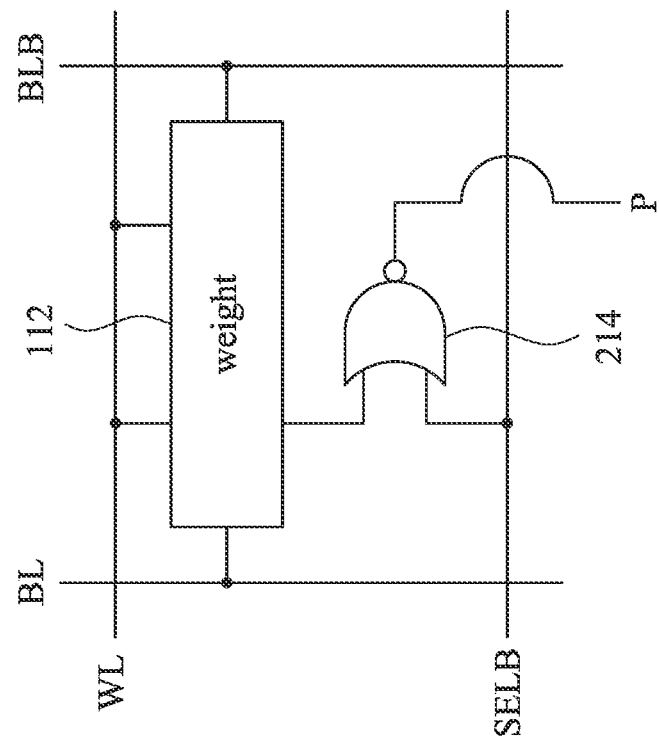
FIG. 3 is a schematic diagram illustrating an example of a memory cell and NOR gate used in the CIM device of FIG. 1 in accordance with some embodiments.
Figure 4:
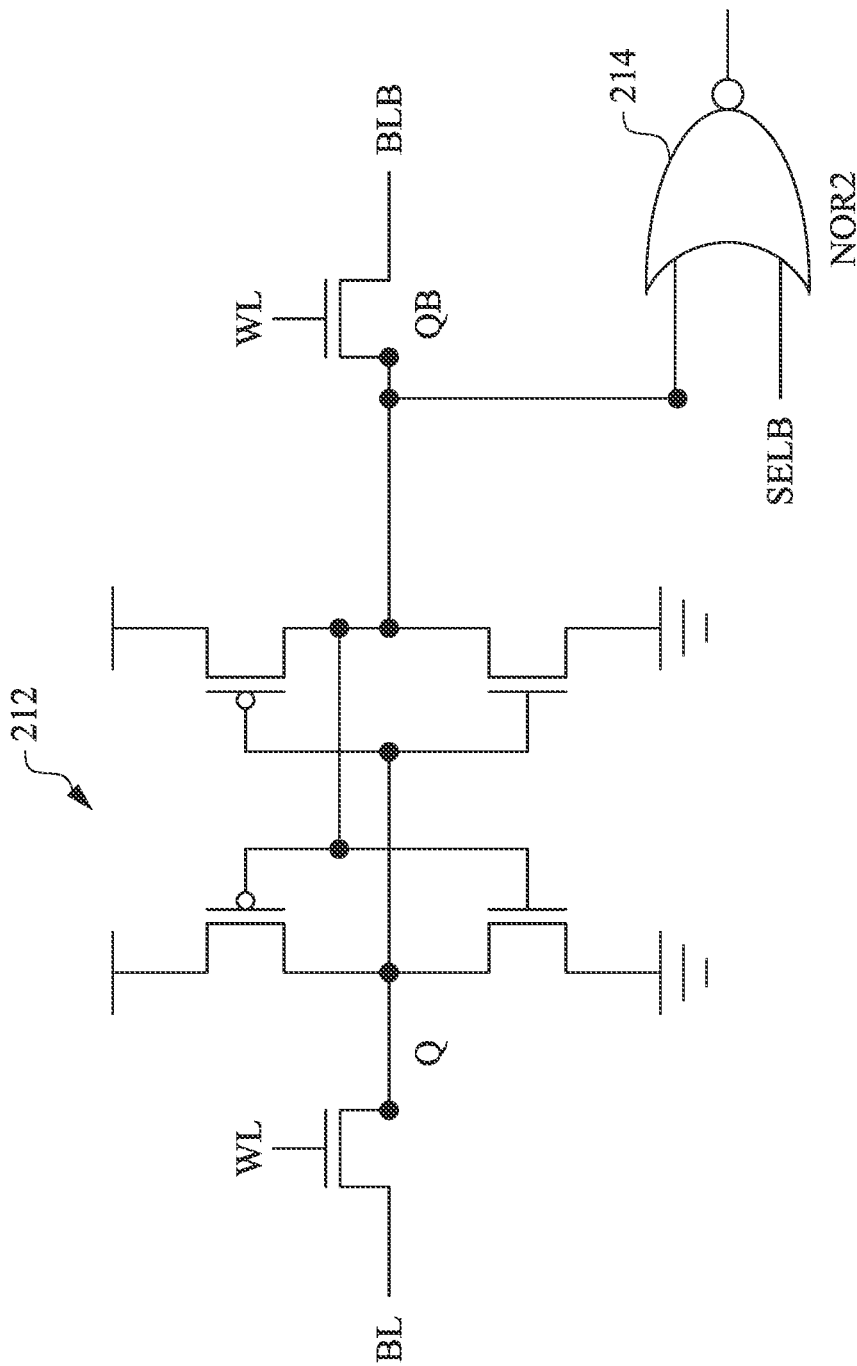
FIG. 4 is a schematic diagram illustrating an example of an SRAM memory cell and NOR gate coupled to a memory cell in the CIM device of FIG. 1 in accordance with some embodiments.

As noted above, in some embodiments the logic circuits 114 are multiplier circuits configured to calculate the $A_U \times WIJ$ portion of equation 1 shown above. FIG. 3 illustrates an example in which the logic circuit 114 is a NOR gate 214 that receives the weight signal W from its corresponding memory cell 112, along with the input signal A in the form of an inverted select signal SELB to output a product P of the weight signal W and the select signal SELB. FIG. 4 illustrates further aspects of a disclosed embodiment where the memory cell is a 6T SRAM cell 212 as shown in FIG. 2 and discussed above, and the multiplier circuit 114 includes the two input NOR gate 214. One input of the NOR gate 214 is coupled to the node QB of the SRAM cell 212 to receive an inverted weight signal, while the other input of the NOR gate 214 receives the SELB signal.

Figure 5:
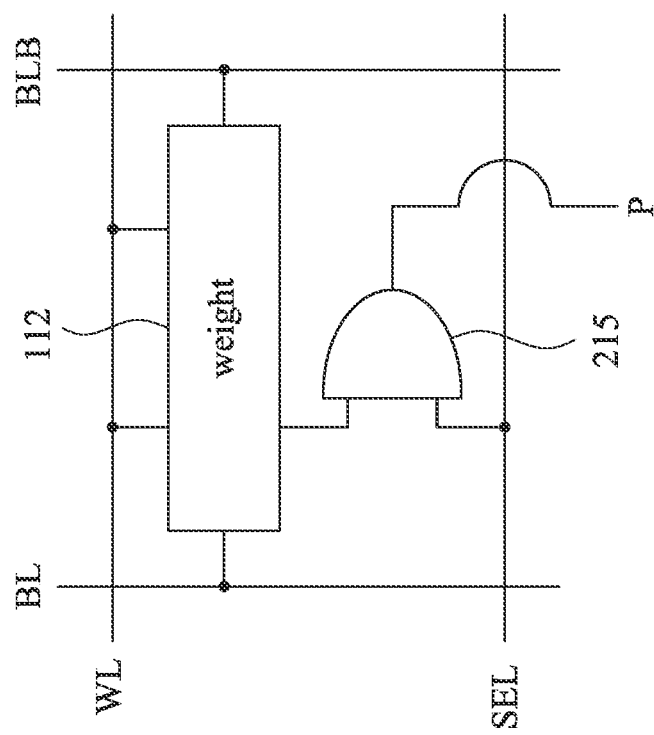
FIG. 5 is a schematic diagram illustrating an example of a memory cell and AND gate used in the CIM device of FIG. 1 in accordance with some embodiments.
Figure 6:
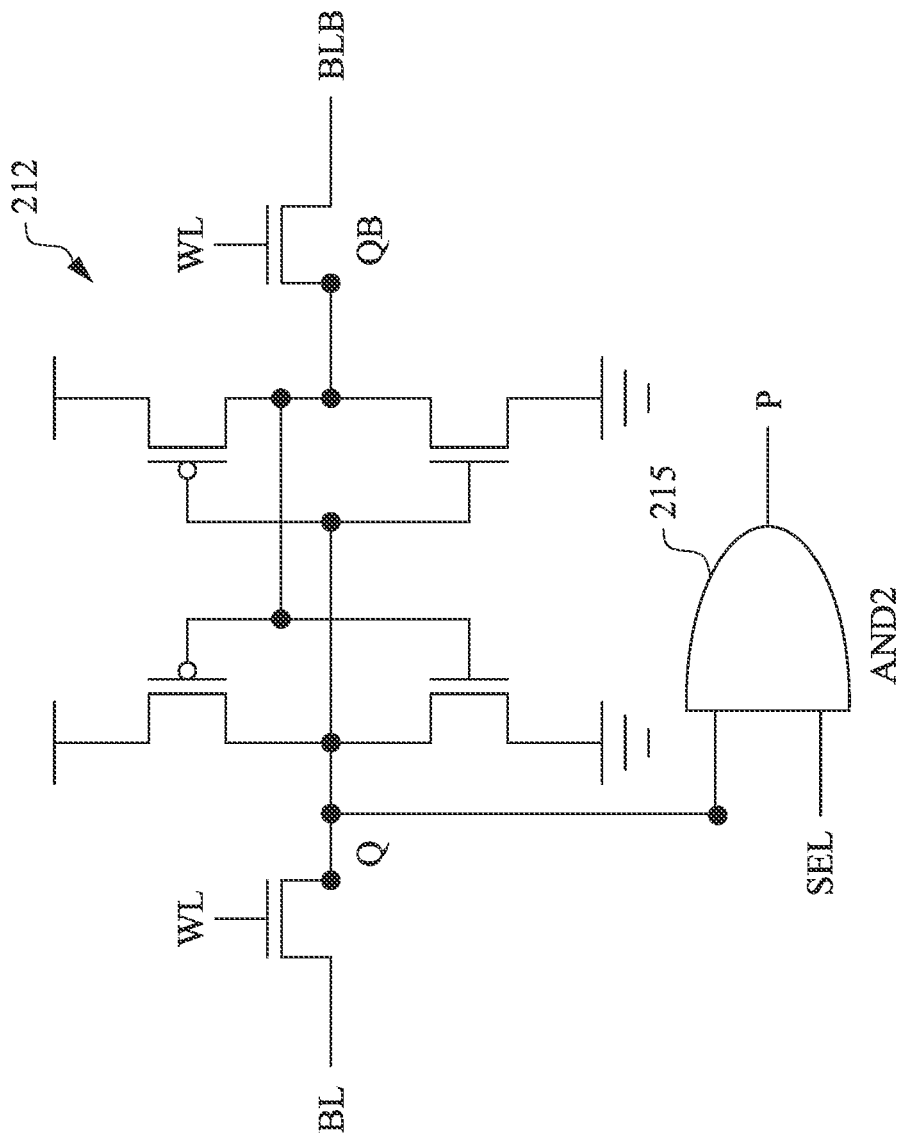
FIG. 6 is a schematic diagram illustrating an example of an SRAM memory cell and AND gate coupled to a memory cell in the CIM device of FIG. 1 in accordance with some embodiments.

FIG. 5 illustrates another example in which the multiplier circuit 114 is an AND gate 215 that receives the weight signal W from its corresponding memory cell 112, along with the input signal A in the form of a select signal SEL to output a product P of the weight signal W and the select signal SEL. FIG. 6 illustrates further aspects of a disclosed embodiment where the memory cell is the 6T SRAM cell 212 as shown in FIG. 2 and discussed above, and the multiplier circuit 114 includes the two input AND gate 215. One input of the AND gate 215 is coupled to the node Q of the SRAM cell 212 to receive the weight signal, while the other input of the AND gate 215 receives the SEL signal.

Figure 7:
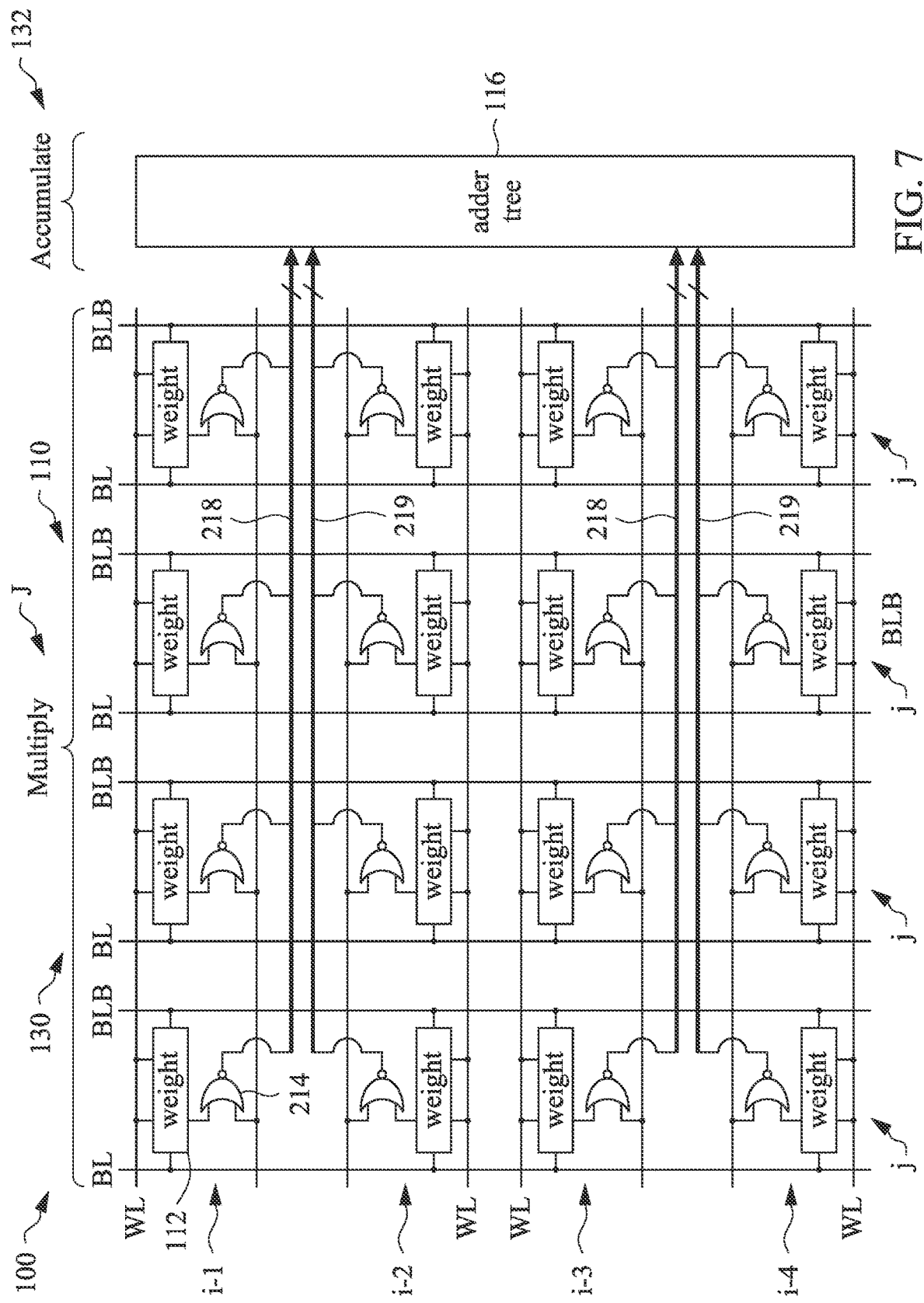
FIG. 7 is a schematic diagram illustrating an example of a CIM memory array in accordance with some embodiments.

FIG. 7 illustrates aspects of an example CIM memory array 110. The memory cells 112 may comprise the SRAM circuit 212 discussed above, or other suitable memory circuits. The multiplier circuits 114 are implemented by the NOR gates 214, though other logic circuits could be used for the multiplier circuits, such as the AND gates 215. In FIG. 7, each of the memory cells 112 stores one bit of the weight signal W. In this example, 4-bit inputs A and 4-bit weights W are used, so four columns j of memory cells 112 and associated NOR gates 214 (i.e. multiplier circuits) are used to store the 4-bit weights in each input row i. In other words, the weight signals are w-bit weights, where w=4. The illustrated portion of the array 110 thus includes a "multiply" section 130 representing one weight column J of the 4-bit weight values, where the weights W stored in the memory cells 112 are multiplied by the received inputs A using the NOR gates 214 (or other suitable logic circuits). In other words, the weight column J has w columns j of memory cells 112 and corresponding NOR gates 214.

Note that in this disclosure, the columns of memory cells 112 and associated logic circuits 214 are designated with a lower case "j." As noted above, in the illustrated example having 4-bit weights W[0:3], the CIM or "weight columns" (i.e. multiply section 130) having four columns j of memory cells are designated with an upper case J. An "accumulate" section 132 receives the products from the multiply section 130 to shift and add the received products as will be discussed further below. As such, FIG. 7 implements a MAC operation represented by $$O = \Sigma_{I=1}^{h-1}(A_I \times WI) \qquad (2)$$

Where $A_I$ is the I-th input, WI is the weight corresponding to the I-th input in the illustrated column, O is the output of the adder tree 116, and h is the accumulated number. In the illustrated example, multi-cycle "bit-wise" multiplication is used, where each bit of the 4-bit weight signal W[0:3] is in turn multiplied by each bit of the input signal A to provide a partial sum.

In the illustrated example, the product output of the NOR gates 214 from adjacent rows i are coupled to the adder circuit 116 by lines 218 and 219. More particularly, the product outputs of the NOR gates 214 of the first row i−1 are received by the line 218 and transmitted to the adder tree 116, while the product outputs of the NOR gates 214 in the adjacent row i−2 are transmitted to the adder tree 116 on line 219.

Figure 8:
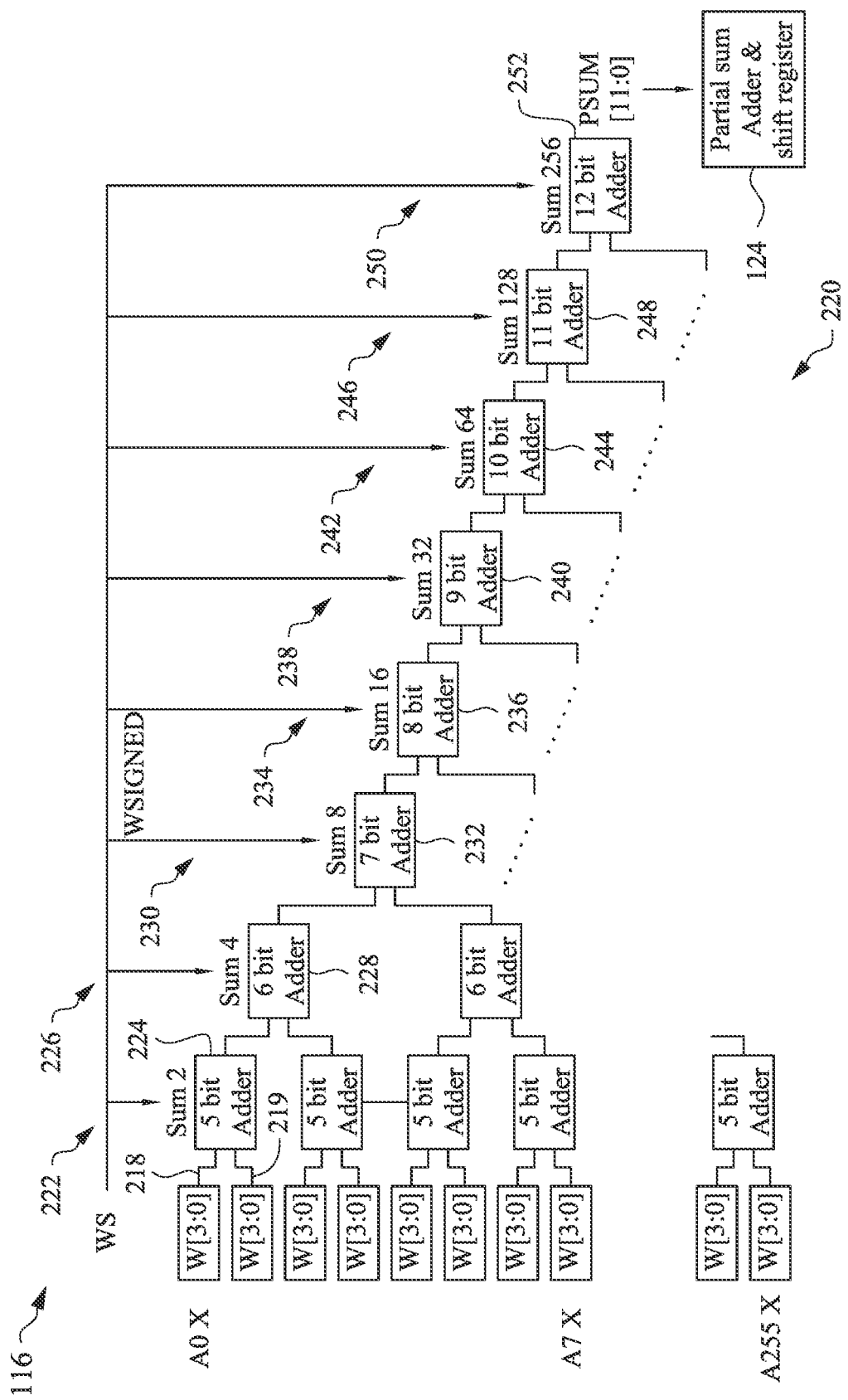
FIG. 8 is a block diagram illustrating an example of an adder tree in accordance with some embodiments.

FIG. 8 illustrates aspects of an example of an adder tree 220 of the adder circuit 116. The adder tree 220 includes eight adder tree branches including a "sum 2" branch 222 that adds the product outputs of two adjacent rows of the array 110. As noted above, the product values include the weight W[3:0] and the input multiplier provided by the input activation driver 102. In FIG. 8, the input values are labeled A0 . . . . A255 (i.e. h−1). The 5-bit adders 224 of the sum 2 branch 222 each add two product outputs of two adjacent rows of multiplier circuits 214. Thus, the product of the first input A0 and the weight W[3:0] is added to the product of the second input A1 and the corresponding weight W[3:0] by the uppermost 5-bit adder 224 in the sum 2 branch 222 of the adder tree 116.

The adder tree further includes a "sum 4" branch 226 having 6-bit adder circuits 228, a "sum 8" branch 230 having 7-bit adder circuits 232, a "sum 16" branch 234 having 8-bit adder circuits 236, a "sum 32" branch 238 having 9-bit adder circuits 240, a "sum 64" branch 242 having 10-bit adder circuits 244, a "sum 128" branch 246 having 11-bit adder circuits 248, and a "sum 256" branch 250 having a 12-bit adder circuit 252.

Each of the 6-bit adder circuits 228 of the sum 4 branch 226 receive the outputs of two adjacent 5-bit adders 224 of the sum 2 branch 222, each of the 7-bit adder circuits 232 of the sum 8 branch 230 receive the outputs of two adjacent 6-bit adders 228 of the sum 4 branch 226, each of the 8-bit adder circuits 236 of the sum 16 branch 234 receive the outputs of two adjacent 7-bit adders 232 of the sum 8 branch 230, each of the 9-bit adder circuits 240 of the sum 32 branch 238 receive the outputs of two adjacent 8-bit adders 236 of the sum 16 branch 234, each of the 10-bit adder circuits 244 of the sum 64 branch 242 receive the outputs of two adjacent 9-bit adders 240 of the sum 32 branch 238, each of the 11-bit adder circuits 248 of the sum 128 branch 246 receive the outputs of two adjacent 10-bit adders 244 of the sum 64 branch 242, and the 12-bit adder circuit 252 of the sum 256 branch 250 receives the outputs of the adjacent 11-bit adders 248 of the sum 128 branch 246.

The 12-bit partial sum PSUM[11:0] output by the twelve bit adder circuit 252 is provided to the accumulator 124, which in the illustrated example includes a partial sum adder and shifter. As will be discussed further below, in addition to the product outputs, each of the adder circuits receives a weight sign bit WS that indicates whether the weight is signed (i.e. negative) or unsigned. Thus, for example, the 4-bit weight W[3:0] multiplied by the inputs $A_I$ are received by the 5-bit adders 224 along with the corresponding weight sign bit WS. The weight sign WS may be stored, for example, in a register associated with the CIM memory array 110.

In some disclosed examples, multi-cycle "bit-wise" multiplication is used for a configurable n-bits signed/unsigned input. As will be discussed below, the calculation is implemented by shifting the input bit-by-bit. The following illustrates an example having a 4-bit input A and 4-bit weight W.

$$I_J = \Sigma_{I=1}^{255}(A_{I[0:3]} \times WI_{J[0:3]}) \qquad (3)$$

Equation 3 above may be restated as follows.

$$\Sigma_{I=1}^{255}(A_{I[0]} \times WI_{J[0:3]}) \times 2^{\wedge}0 + \Sigma_{I=1}^{255}(A_{I[1]} \times WI_{J[0:3]}) \times 2^{\wedge}1 + \Sigma_{I=1}^{255}(A_{I[2]} \times WI_{J[0:3]}) \times 2^{\wedge}2 + \Sigma_{I=1}^{255}(A_{I[3]} \times WI_{J[0:3]}) \times 2^{\wedge}3 \times (-1)^{\wedge}(\text{SIGNED}) \qquad (4)$$

For a signed input, a two's complement adder configuration may be employed. Thus, if the weight input is signed (WS=1), the most significant bit (MSB) computation result is changed to negative (i.e. invert the result and add 1).

Figure 9:
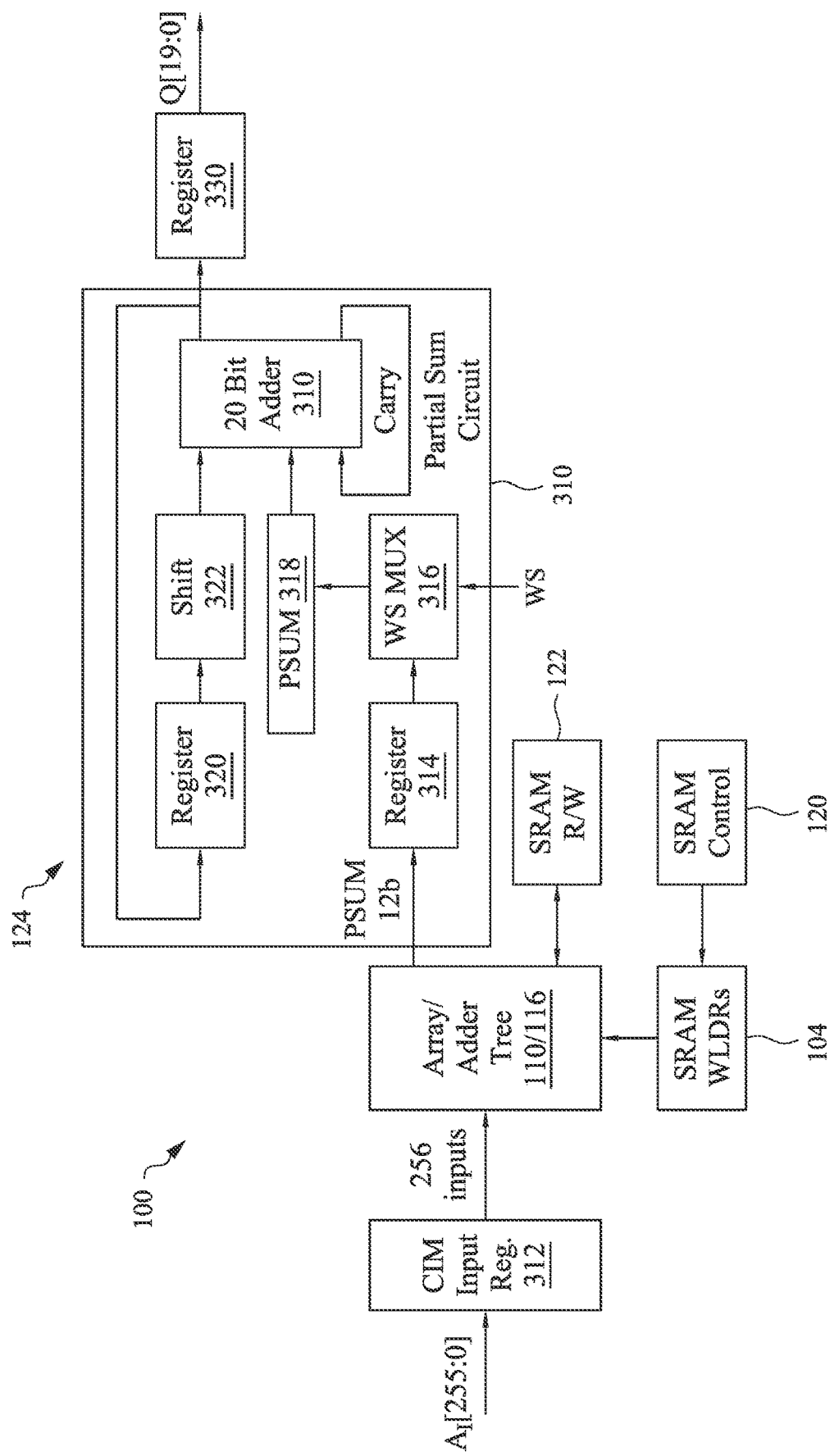
FIG. 9 is a block diagram illustrating an example of an accumulator in accordance with some embodiments.

FIG. 9 illustrates an example of the CIM device 100, including further aspects of the accumulator 124. As noted previously, the CIM memory array 110 includes the array of memory cells 112 configured to store the weight signals W. The input signals $A_i$ are stored in an input register 312 and multiplied by the weights W[0:3] stored in the array 110, and the adder tree 116 provides 12 bit partial sums PSUM[11:0] as shown in FIG. 7. The WL driver 104 outputs WL signals to the memory array 110, and the memory controller 120 receives control inputs and provides control signals to the SRAM read/write circuit 122 connected to the bitlines of the memory array 110. The output signals from the logic circuits array 110 are provided to the adder circuit 116, and the accumulator circuit 124 is coupled to the adder circuit 116 and is configured to provide the MAC output $O_J$.

The partial sums from the adder tree 116 are output to a first register 314 of a partial sum circuit. The first MUX 316 receives the partial sum output PSUM[11:0] and its inverse, and outputs the selected input based on the product of the weight sign input WS and the most significant weight bit SIGNED*MSB. Thus, if the MSB of the PSUM input is signed (i.e. WS=1), the MSB result is changed to negative by inverting the result and adding 1. This partial sum 318 is provided to one input of a 20 bit adder 310.

The output of the 20 bit adder 310 is received by a second partial sum register 320, the output of which is received by a shifter 322 and left-shifted 1 bit (i.e. multiplied by 21) and received at a second input of the 20 bit adder 310 and summed with the next partial sum 318. An output register 330 receives the output of the 20 bit adder 310 at its D input, and provides the output Q[19:0] of the accumulator at its Q output terminal.

Figure 10:
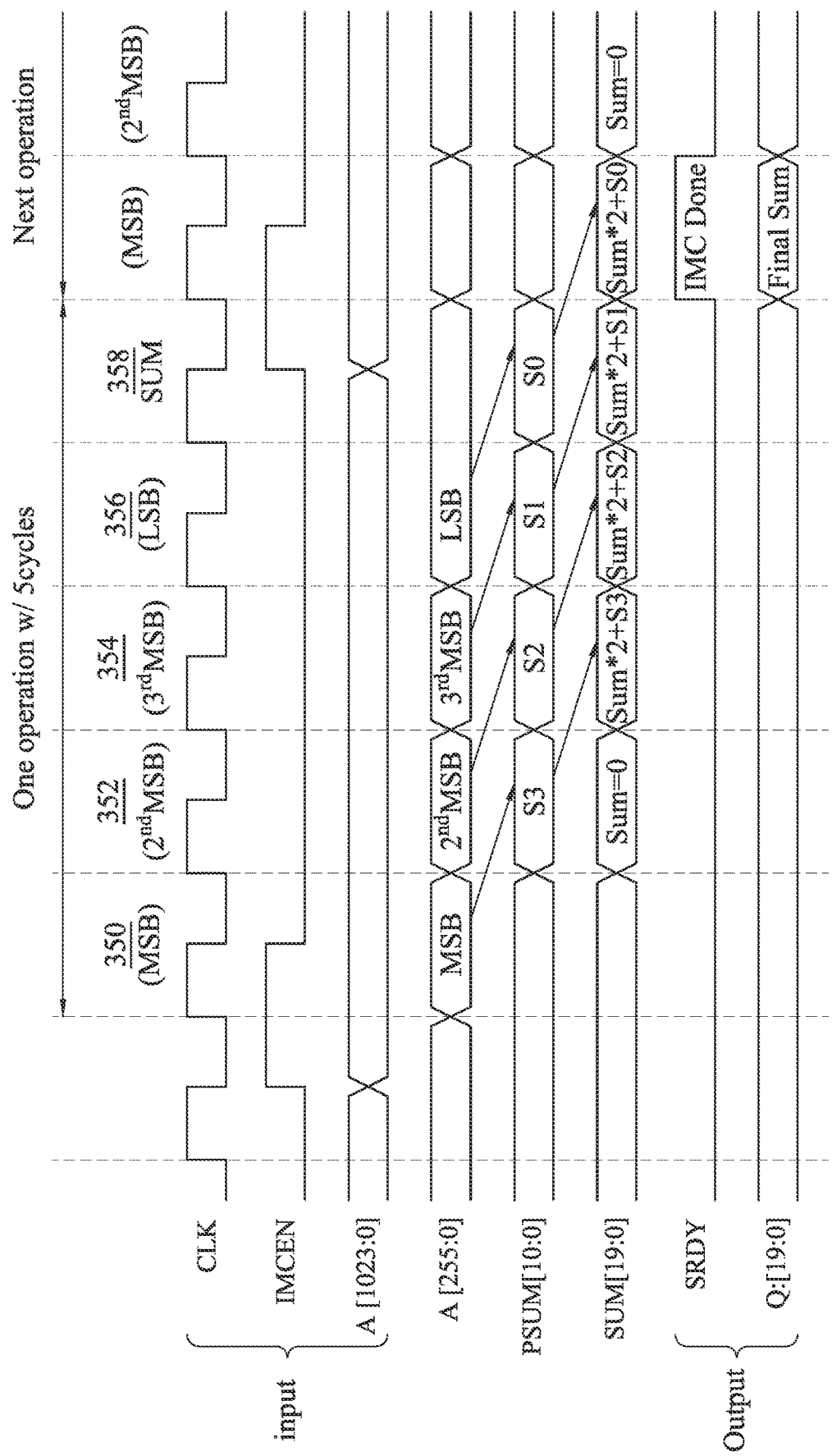
FIG. 10 is a timing diagram illustrating timing for the CIM output calculations in accordance with some embodiments.

FIG. 10 is a timing diagram illustrating operations for the adder tree 116 and the accumulator 124. In the examples discussed above, a 4-bit weight W[0:3] is shown, though other weight configurations are within the scope of this disclosure. FIG. 10 illustrates a 5-cycle operation. Inputs include a clock signal CLK, an IMCEN signal that marks the beginning and end of the 5-cycle operations, and the input signals A[1023:0]. Each bit of the 4-bit input signal A[3:0] is multiplied by the weight signal W[3:0]. During a first operation cycle 350, the MSB of the input A is multiplied by each bit of the weight W[3:0] by the logic circuits 114 of the CIM array 110 to produce partial products that are added by the adder tree 116 resulting in the 12-bit partial sum S3.

During a second operation cycle 352, the second MSB of the input A is multiplied by each bit of the weight W[3:0] by the logic circuits 114 of the CIM array 110 to produce partial products that are added by the adder tree 116 resulting in the 12-bit partial sum S2. The third MSB of the input A is multiplied by each bit of the weight W[3:0] by the logic circuits 114 of the CIM array 110 to produce partial products that are added by the adder tree 116 resulting in the 12-bit partial sum S1 during a third operation cycle 354, and the LSB of the input A is multiplied by each bit of the weight W[3:0] by the logic circuits 114 of the CIM array 110 to produce partial products that are added by the adder tree 116 resulting in the 12-bit partial sum S0 during a fourth operation cycle 356.

The partial sum PSUM[11:0] outputs S3, S2, S1 and S0 are delayed one cycle, and as such are output to the first partial sum register 314 during the second 352, third 354, fourth 356 and fifth 358 operation cycles, respectively. Thus, at the first operation cycle 350, there is no partial sum input from the first partial sum register 314 to the 20-bit adder 310. There is also no output from the adder 310 to the register 320 and shifter 322 and consequently, at the second operation cycle 352, the SUM[15:0]=0.

As noted above, at the second operation cycle 352, the S3 partial sum is provided to the first register 314 and input to the first input of the adder 310. The previous output of the adder 310 (i.e. Sum=0) is received by second register 320, left shifted 1 bit by the shifter 322, and input to the second input of the adder 310. The SUM[15:0] output by the adder 310 during the third operation cycle 354 is thus the S3 partial sum. At the third operation cycle 354 the second partial sum S2 for the second MSB is output by the adder tree 116 and received by the first register 314 and input to the adder 310. The sum output by the adder 310 during the third operation cycle 354 (i.e. the S3 partial sum) is output by the register 320 and left shifted by the shifter 322. During the fourth operation cycle 356, the shifted sum is thus added to the S2 partial sum.

At the fourth operation cycle 356 the next partial sum S1 for the third MSB is output by the adder tree 116 and received by the first register 314 and input to the adder 310. The sum output by the adder 310 during the fourth operation cycle 356 is output by the register 320 and left shifted by the shifter 322. During the fifth operation cycle 358, the shifted sum is thus added to the S1 partial sum.

At the fifth operation cycle 358 the next partial sum S0 for the LSB is output by the adder tree 116 and received by the first register 314 and input to the adder 310. The sum output by the adder 310 during the fifth operation cycle 358 is output by the register 320 and left shifted by the shifter 322. During the first operation cycle 360 of the next operation, the shifted sum is thus added to the S0 partial sum. The SRDY signal is asserted during this cycle, and in response thereto the final sum Q[19:0] is output by the output register 330.

The programmable signed/unsigned weight disclosed above may be used to support configurable n-bits weight. In other words, multiple CIM or weight columns J may be combined to store the desired number n of weight bits. Referring back to FIG. 7, the illustrated array 100 includes a 4-bit weight column J. As such, the weight column J has four columns of memory cells 112 and associated NOR gates 214 to store each bit of the 4-bit weight value. If a larger weight value is desired, multiple weight columns J may be combined. For instance, two 4-bit weight columns J may be combined to provide an 8-bit weight value. An example of an 8-bit weight having a signed MSB is shown below.

| W7 | W6 | W5 | W4 | W3 | W2 | W1 | W0 |
|---|---|---|---|---|---|---|---|
| −128 | 64 | 32 | 16 | 8 | 4 | 2 | 1 |

Such an 8-bit signed weight can be separate into a 4-bit signed weight plus a 4-bit unsigned weight as shown below (16 is factored out of the first 4-bit weight).

| 16*(W7 | W6 | W5 | W4) | + | (W3 | W2 | W1 | W0) |
|---|---|---|---|---|---|---|---|---|
| −8 | 4 | 2 | 1 | | 8 | 4 | 2 | 1 |

The MAC operation my thus be expressed as follows.

$$O_J = \Sigma_{I=1}^{255}(A_{I[0:7]} \times WIJ_{[0:7]}) \Rightarrow \Sigma_{I=1}^{255}(A_{I[0:7]} \times WIJ_{[0:3]}) + \Sigma_{I=1}^{255}(A_{I[0:7]} \times WIJ_{[4:7]}) \quad (5)$$

Figure 11:
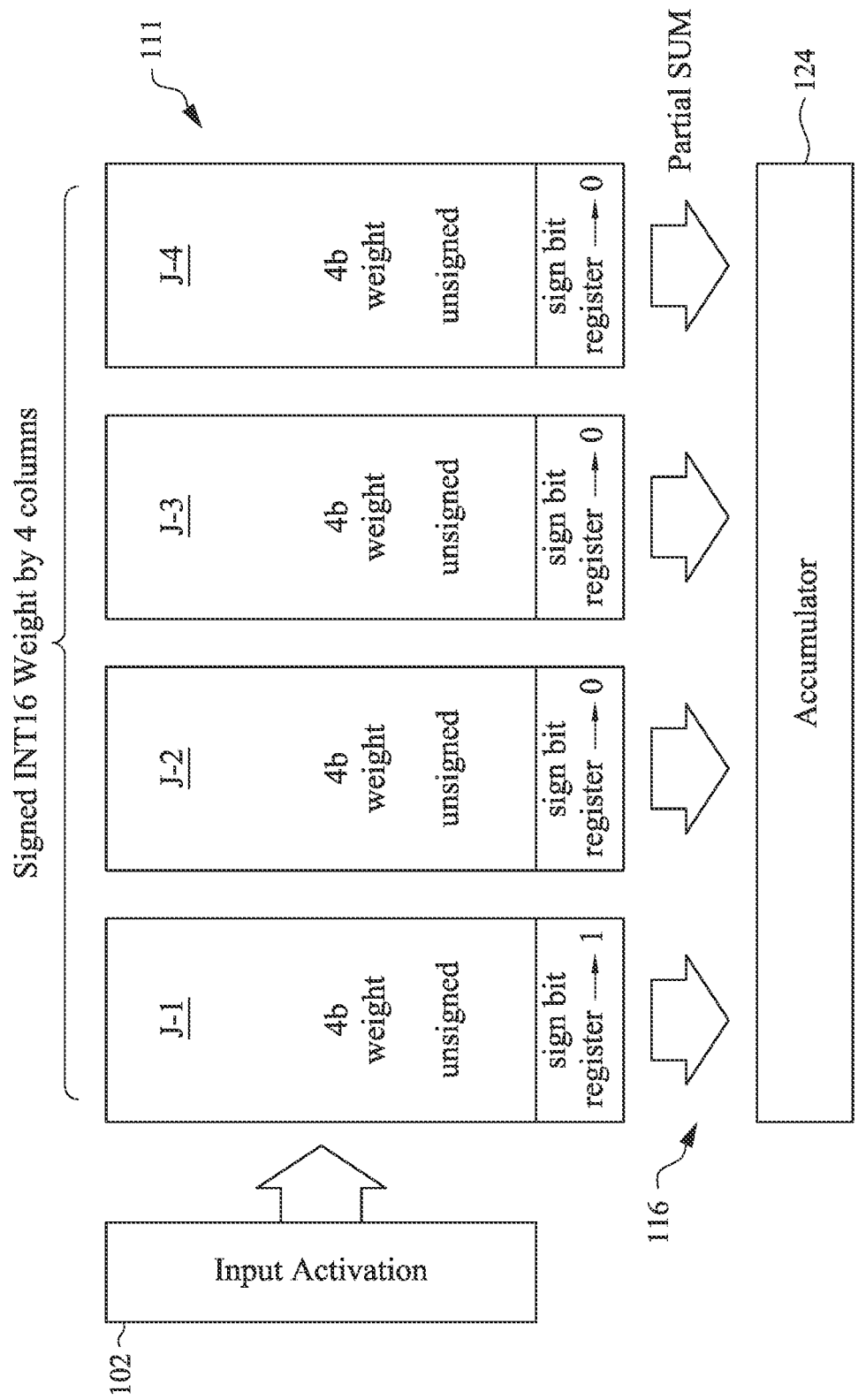
FIG. 11 is a block diagram illustrating portions of a CIM memory array where multiple weight columns are combined in accordance with some embodiments.

FIG. 11 illustrates an example CIM memory array 111 where four, 4-bit weight columns J-1, J-2, J-3, J-4 are combined to provide a sixteen-bit signed weight value. Each of the weight columns J-1, J-2, J-3, J-4 shown in FIG. 11 have four memory array columns j for storing the 4-bit weights as in the example shown in FIG. 7. The first weight column J-1 is signed, while the remaining weight columns J-2, J-3 and J-4 are unsigned as only the MSB of the weight value is signed. An input driver 102 controls activation of the input signals $A_I$ multiplied by the weight values. The product outputs of the weight columns J-1, J-2, J-3, J-4 are partially summed by trees 116 associated with each of the weight columns J, and the partial sums are provided to the accumulator 124 for the shift/add operation to compute the final CIM output.

Figure 12:
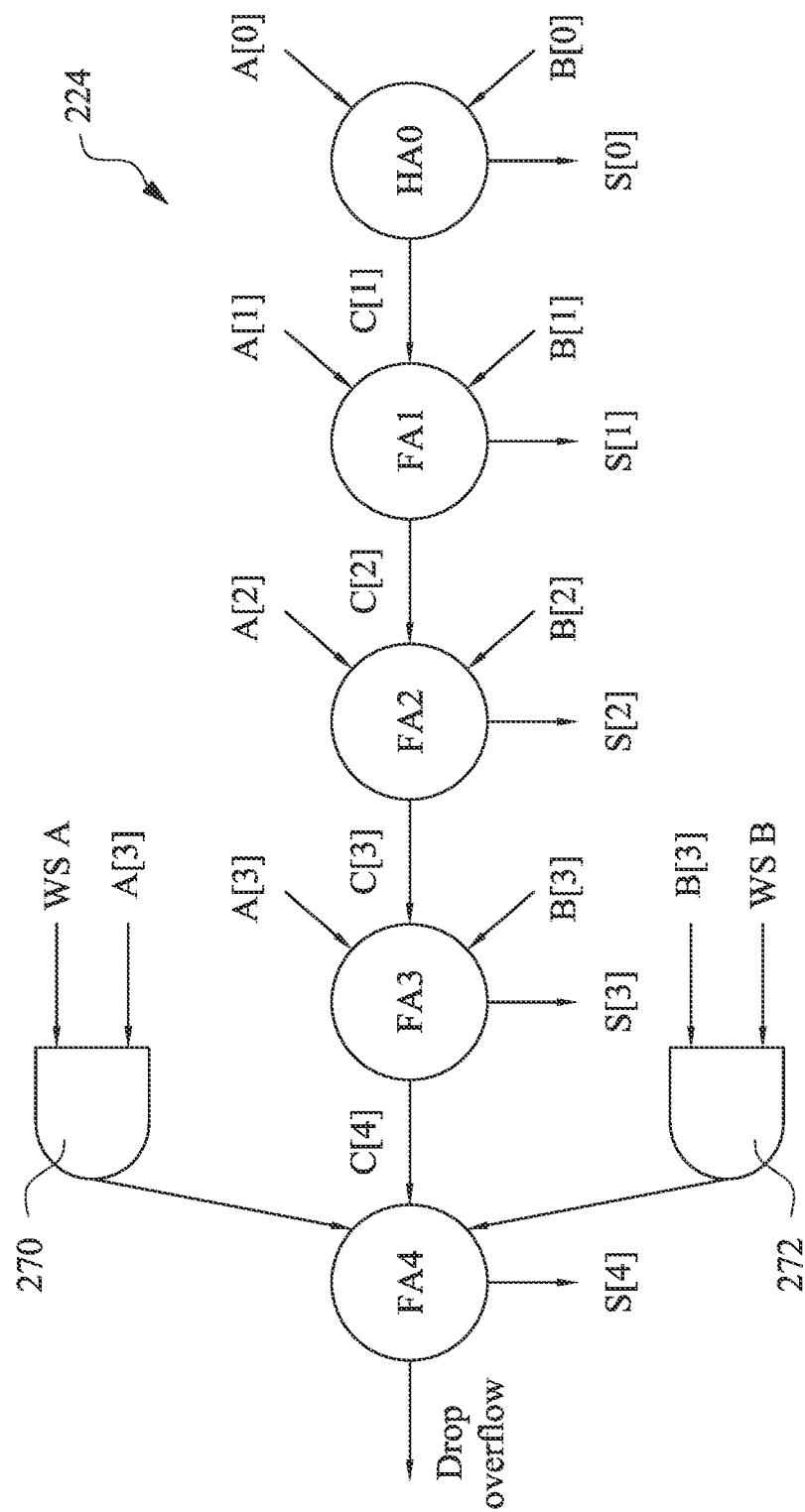
FIG. 12 is a block diagram illustrating an adder circuit combined with a signed/unsigned weight format in accordance with some embodiments.

FIG. 12 illustrates an example of the 5-bit adder circuit 224 of the sum 2 branch 222 of the adder tree 220. As noted above, in the illustrated example the 4-bit product outputs from adjacent rows of the array are output to the 5-bit adder circuits 224 of the adder tree 116. In FIG. 8, the product outputs of the adjacent rows 218, 219 are received by the 5-bit adder 224. In FIG. 12, these inputs of adjacent rows 218, 219 are labeled A and B, respectively. For example, the 4-bit outputs of the NOR gates 214 of the row i−1 are labeled A[3:0] in FIG. 12, while the 4-bit outputs of the NOR gates 214 of the row i−2 are labeled B[3:0].

The 5-bit adder circuit 224 includes a half adder circuit HA0 that receives the first output bits A[0] and B[0] and provides a bit 0 sum output S[0], along with a first carry output C[1]. The 5-bit adder circuit 224 further includes four full adder circuits FA1, FA2, FA3 and FA4. The first full adder FA1 receives the outputs of the bit 1 NOR gates A[1] and B[1], along with the first carry output C[1] from the half adder HA0. The first full adder FA1 adds the inputs A[1] and B[1] and provides a bit 1 sum output S[1], along with a second carry output C[2]. The second full adder FA2 receives the bit 2 outputs of the bit 2 NOR gates along with the second carry output C[2] from the first full adder FA1. The second full adder FA2 adds the inputs A[2] and B[2] and provides a bit 2 sum output S[2], along with a third carry output C[3]. The third full adder FA3 receives the outputs of the bit 3 NOR gates 214 A[3] and B[3], along with the third carry output C[3] from the second full adder FA2. The third full adder FA3 adds the bit 3 inputs A[3] and B[3] and provides a bit 3 sum output S[3], along with a fourth carry output C[4].

The fourth full adder FA4 receives the outputs of two AND gates 270 and 272 along with the fourth carry output C[4] from the third full adder FA3. The AND gate 270 receives at its inputs the A[3] signal and the weight sign WSA for the A inputs, while the AND gate 272 receives at its inputs the B[3] signal and the weight sign WSB for the B inputs. By providing the AND gates 270 and 272 configured to receive the weight sign indicators WS, the adder circuit 224 becomes "switchable" for signed and unsigned weight formats as will be discussed further below.

Figure 13:
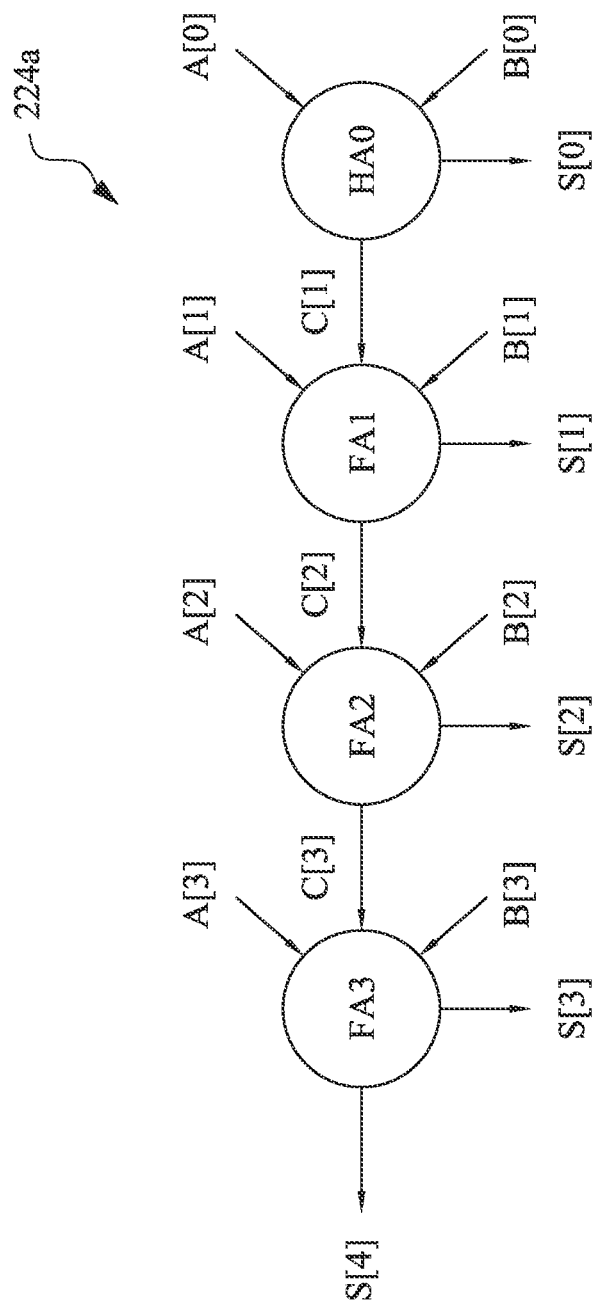
FIG. 13 is a block diagram illustrating a binary adder circuit in accordance with some embodiments.

More particularly, if the weights are unsigned, the 4-bit weight values can be added using a 4-bit binary adder 224a as shown in FIG. 13. The binary adder 224a includes the half adder circuit HA0 that receives the first output bits A[0] and B[0] and provides a bit 0 sum output S[0], along with a first carry output C[1]. However, the binary adder 224a only uses three full adder circuits FA1, FA2 and FA3. The three full adder circuits FA1, FA2, FA3 along with the half adder HA0 are able to add the unsigned 4-bit inputs A[3:0] and the unsigned 4-bit B[3:0] inputs.

Figure 14:
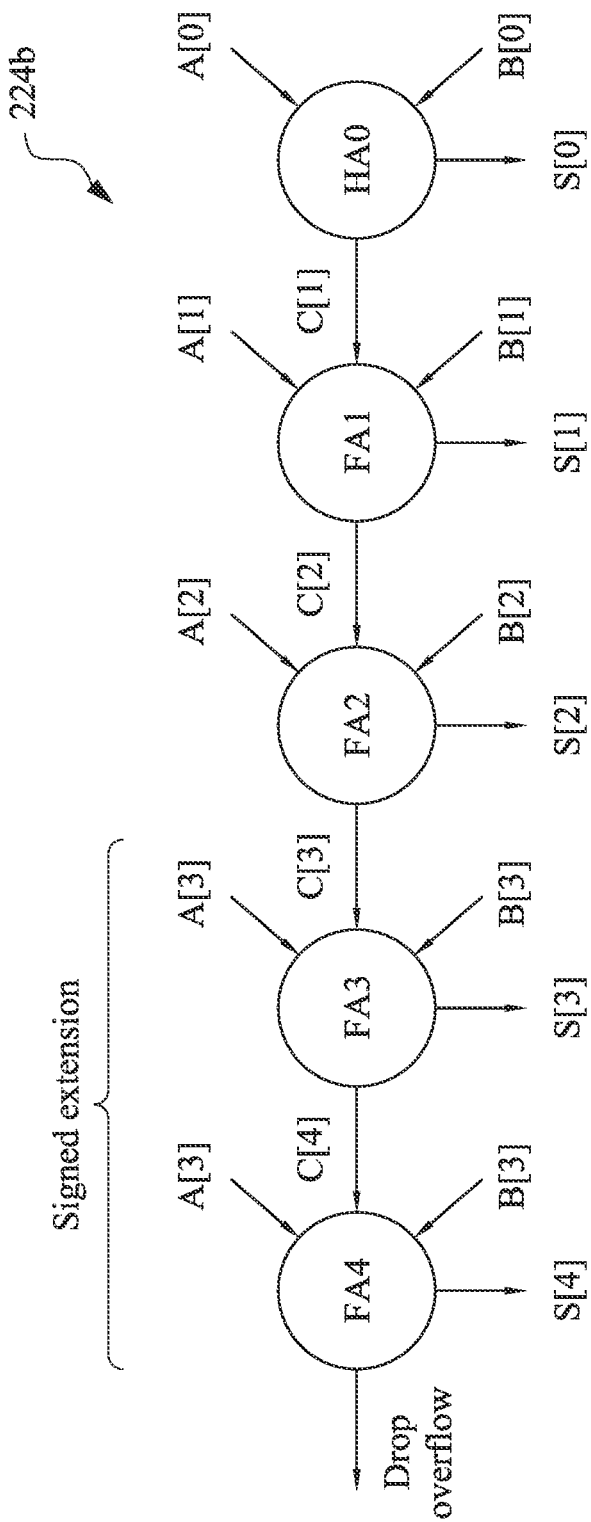
FIG. 14 is a block diagram illustrating a two's complement adder circuit in accordance with some embodiments.

With signed weight inputs, a two's compliment adder circuit 224b is used as shown in FIG. 14 for addition of negative values as indicated by the weight sign extension WS. The two's compliment adder 224b includes a half adder circuit HA0 that receives the first output bits A[0] and B[0] and provides a bit 0 sum output S[0], along with a first carry output C[1]. The 5-bit adder circuit 224 further includes four full adder circuits FA1, FA2, FA3 and FA4. The first full adder FA1 receives the outputs of the bit 1 NOR gates A[1] and B[1], along with the first carry output C[1] from the half adder HA0. The first full adder FA1 adds the inputs A[1] and B[1] and provides a bit 1 sum output S[1], along with a second carry output C[2]. The second full adder FA2 receives the bit 2 outputs of the bit 2 NOR gates along with the second carry output C[2] from the first full adder FA1. The second full adder FA2 adds the inputs A[2] and B[2] and provides a bit 2 sum output S[2], along with a third carry output C[3]. The third full adder FA3 receives the outputs of the bit 3 NOR gates 214 A[3] and B[3], along with the third carry output C[3] from the second full adder FA2. The third full adder FA3 adds the bit 3 inputs A[3] and B[3] and provides a bit 3 sum output S[3], along with a fourth carry output C[4].

The fourth full adder FA4 receives the outputs of the bit 3 NOR gates 214 A[3] and B[3], along with the fourth carry output C[4] from the third full adder FA3. The third full adder FA3 adds the bit 3 inputs A[3] and B[3] and provides a bit 3 sum output S[3], along with a fourth carry output C[4].

Returning to FIG. 12, the addition of the AND gates 270 and 272 makes the adder 224 "switchable" so that if neither of the MSB weight inputs A[3], B[3] are signed, the AND gates 270 and 272 both output a 0 and the fourth full adder FA4 is effectively taken out of the circuit, with the fourth carry output C[4] providing the fifth sum bit S[4]. Alternatively, if either of the weight inputs A[3], B[3] are signed, the AND gates 270, 272 provide an output based on the MSB weight inputs A[3], B[3]. The S[4] output of the fourth full adder FA4 provides the sign extension for the sum output S[3].

Figure 15:
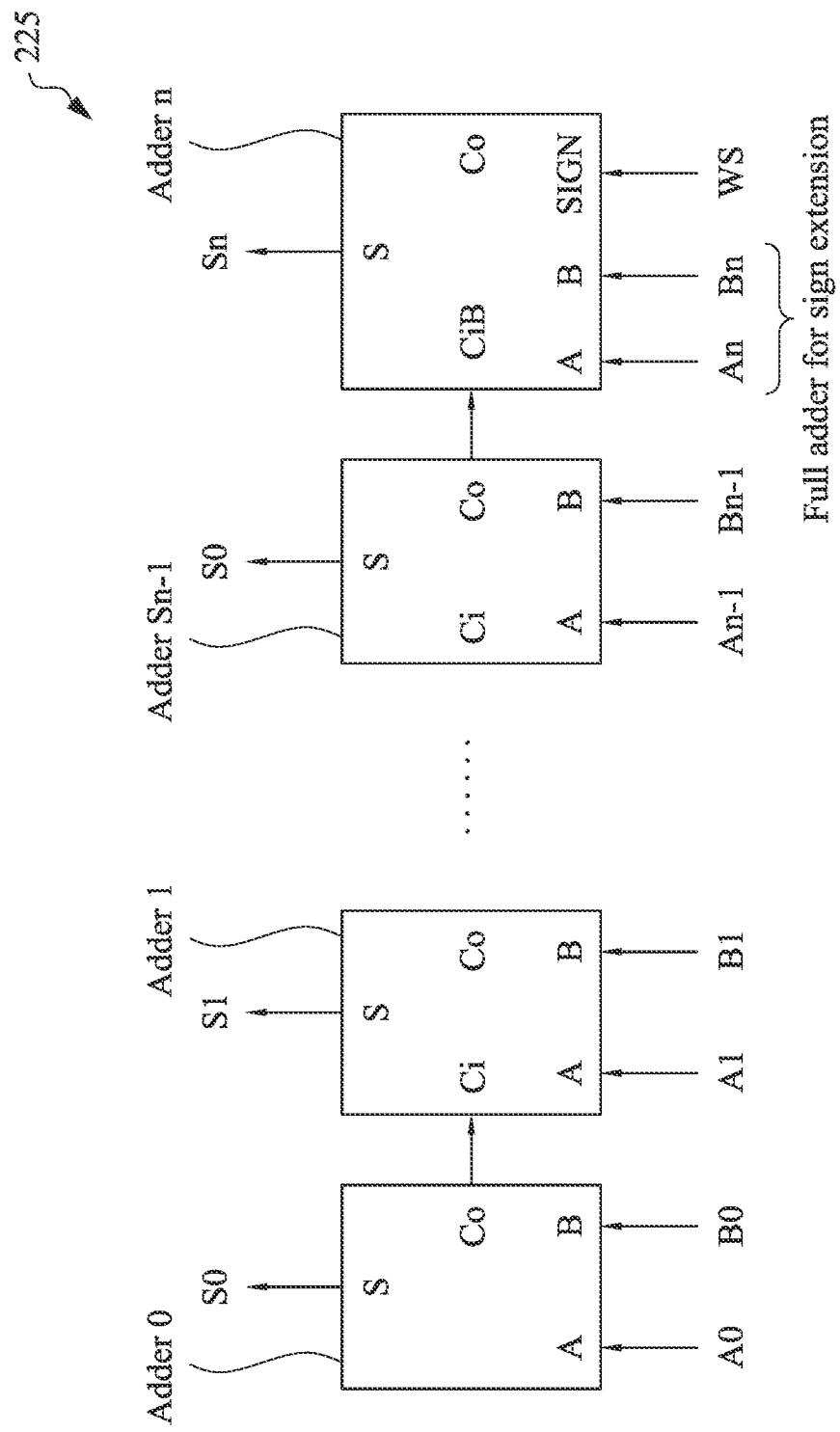
FIG. 15 is a block diagram illustrating an adder circuit configuration in accordance with some embodiments.

The 5-bit adder 224 shown in FIG. 12 is used in the sum 2 branch 222 of the adder tree 220 shown in FIG. 8. The 5-bit outputs S[4:0] of the 5-bit adders 224 are received by the 6-bit adders 228 of the sum 4 branch 226 of the adder tree 220. FIG. 15 illustrates a generic form 225 of the adders used in the adder tree 220. Each of the adders receive respective product bits A[0:n] and B[0:n], and the MSB adder n further receives one-bit weight sign WS. For instance, the 5-bit adders 224 receive 4-bit product signals A[0:3] and B[0:3] as well as the one-bit weight sign extension WS. As such, 5-bit adders 224 employ one half adder HA and four full adders FA1-FA4.

Thus, the generic adder circuit 225 shown in FIG. 15 has n adders that provide n sum outputs. The n adders include a half adder Adder0 that receives the A[0] and B[0] product inputs and outputs the S[0] sum output. The n adders further include n−1 full adders. The first full adder Adder1 receives the A1 and B1 inputs as well as the carry output Co from the half adder Adder0. Each of the full adders receive the appropriate A and B inputs as well as the carry in bit Ci from the preceding adder, and output the corresponding sum output and carry output bit Co.

The nth adder (full adder) receives the sign extension WS and carry in bit from the Sn−1 adder, as well as the An and Bn inputs, and the Adder n outputs the carry out bit Co and the S[n] sum bit, which is the WS bit. In the illustrated example the Adder n receives the inverse of the carry out bit of the Adder n−1 (i.e. Carry in Bar CiB) at its carry in input.

FIG. 16 illustrates a truth table for the nth adder of the adder circuit 225 shown in FIG. 15. As discussed in conjunction with FIG. 12, the nth adder (i.e. FA4) receives the C[4] carry in bit Ci and the outputs of the AND gates 270 and 272. The AND gates 270 and 272 receive the MSB product bits A[3] and B[3], respectively, along with the corresponding weight sign extension bits WSA and WSB. FIG. 16 illustrates the sum outputs for unsigned weights (WS=0) and signed weights (WS=1) corresponding to the various input combinations of A, B and Ci.

If the WS bit is 1—i.e. the weight is signed, the cases where A=B=0, Ci=1 and A=B=1, Ci=0 will not occur for the nth adder (FA4 in FIG. 12) since the output of the AND gates 270, 272 will follow the A and B inputs. For example, referring to FIG. 12, the FA3 and FA4 full adders (i.e. n−1th and nth adders) both receive the A[3] and B[3] inputs when the WSA and WSB extensions are 1 (signed weights). If A[3]=B[3]=0, the carry out bit Co of the FA3 adder will be 0. Therefore, the case of A=B=0, Ci=1 for the FA4 adder will never occur. Similarly, if A[3]=B[3]=1, the carry out bit Co of the FA3 adder will be 1, and the case of A=B=1, Ci=0 for the FA4 adder will also never occur. Still further, the overflow (i.e. carry) of the nth adder is dropped. Accordingly, the circuit of the nth adder circuit can be simplified, thus reducing the number of transistors used to implement this full adder.

Figure 17:
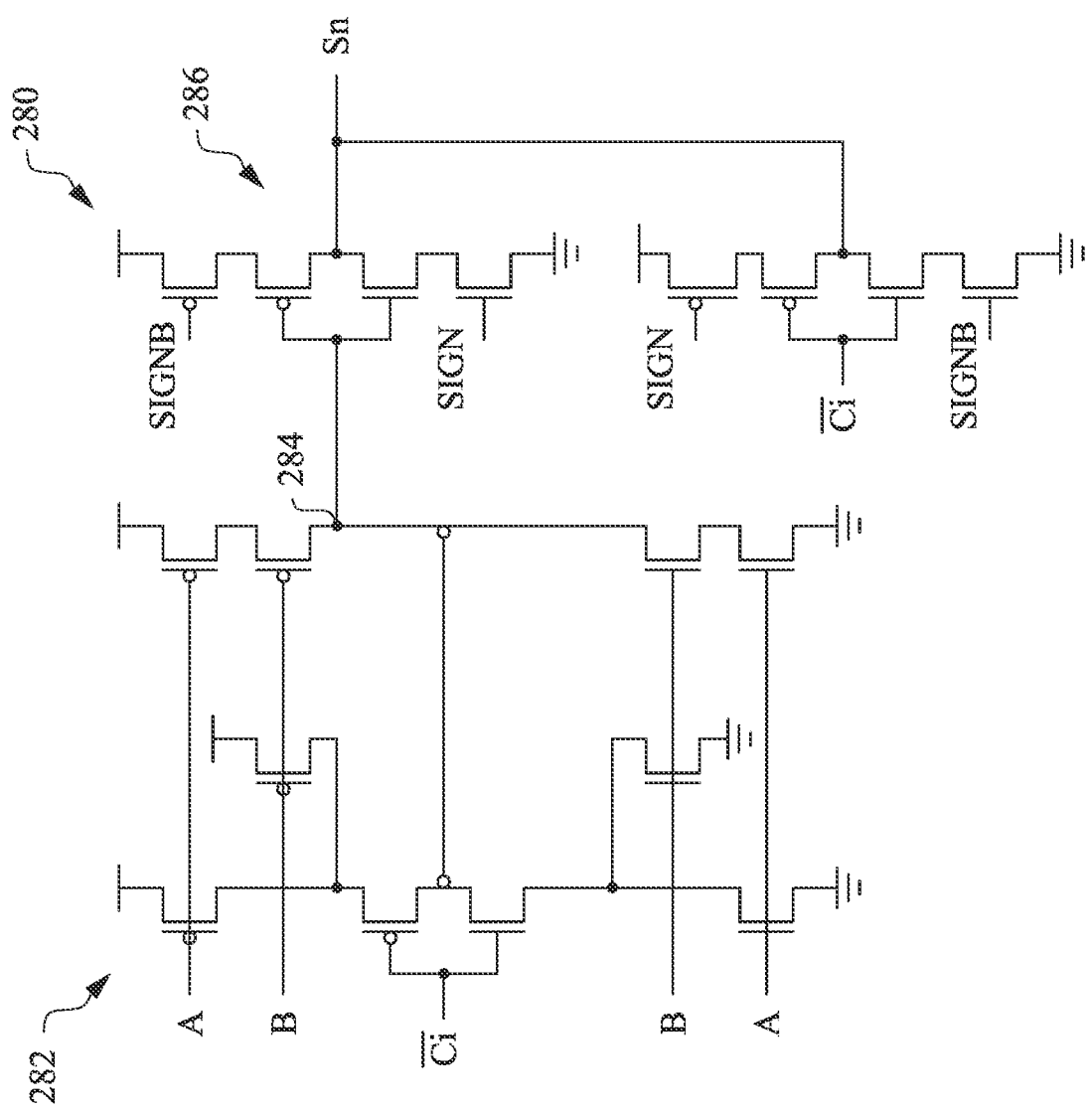
FIG. 17 is a schematic diagram illustrating an example of a simplified adder circuit in accordance with disclosed embodiments.

FIG. 17 illustrates an example of an adder circuit 280 used for the nth adder, such as the full adder FA4 of the 5-bit adder 224 shown in FIG. 12. As compared to combining the two AND gates 270, 272 with a conventional full adder circuit, the circuit shown in FIG. 17 reduces the transistor count by 22 transistors in some examples. The adder circuit 280 of FIG. 17 uses 10 transistors that implement an input circuit 282 configured to receive A and B input bits and the CiB signal (i.e. inverted Ci signal received from the n−1 adder). Based on these inputs, an intermediate signal is provided at a node 284. The node 284 is an input to an output circuit 286 that receives also receives the CiB signal along with the SIGN extension signal and its inverse SIGNB to provide the Sn sum output.

Figure 18:
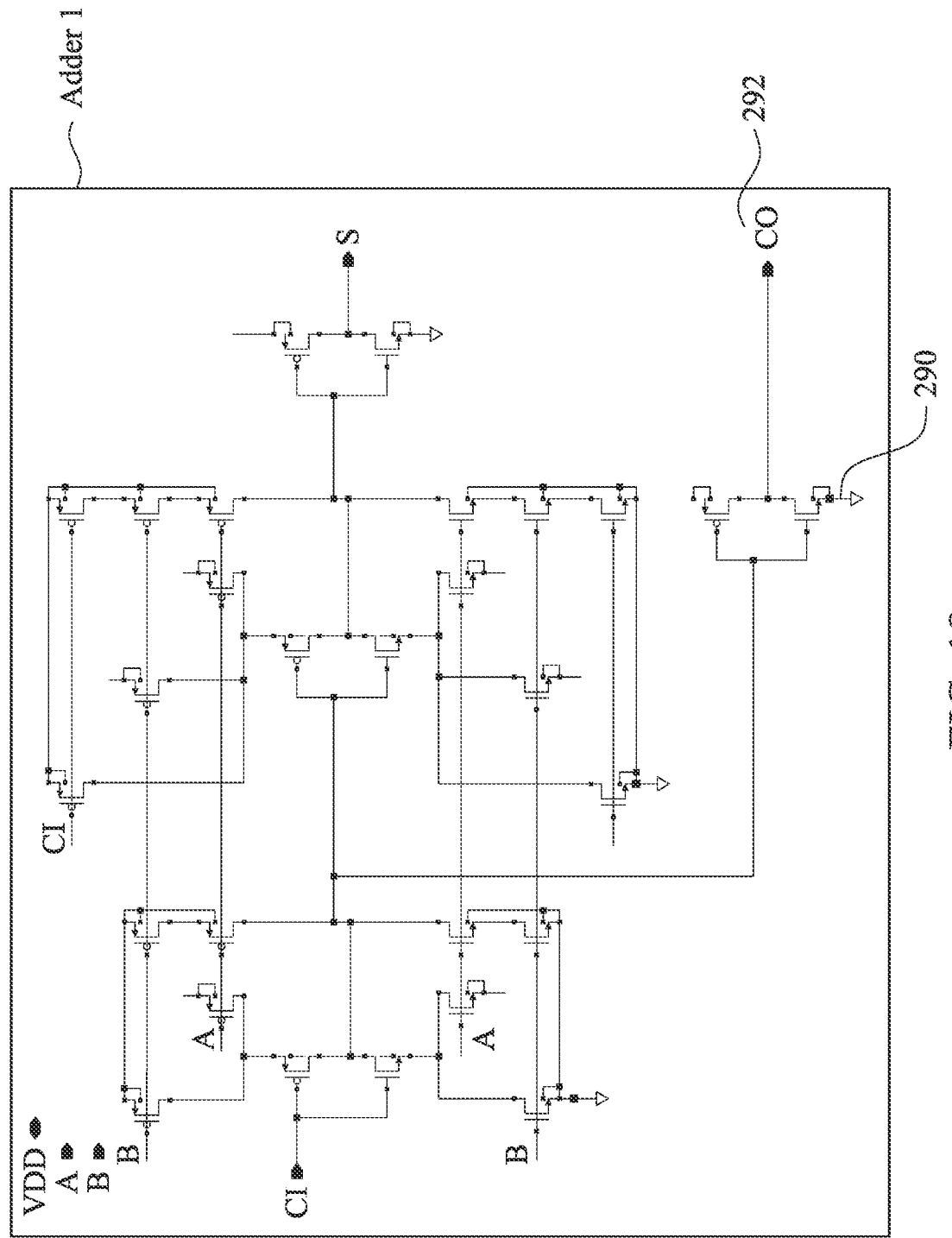
FIG. 18 is a schematic diagram illustrating an example of a full adder in accordance with disclosed embodiments.

As noted above, the simplified adder circuit 280 receives the inverse of the carry out signal Co from the preceding full adder (n−1 adder). Thus, the n−1 adder is modified to output the inverse of the Co signal (i.e. CiB signal). FIG. 18 is a schematic diagram illustrating an example of the full adder circuit, such as the Adder1 full adder shown in FIG. 15. The illustrated Adder1 circuit includes an inverter 290 that provides the carry out signal Co at a carry out terminal 292. The carry out bit Co is output to the carry in terminal Ci of the succeeding adder.

Figure 19:
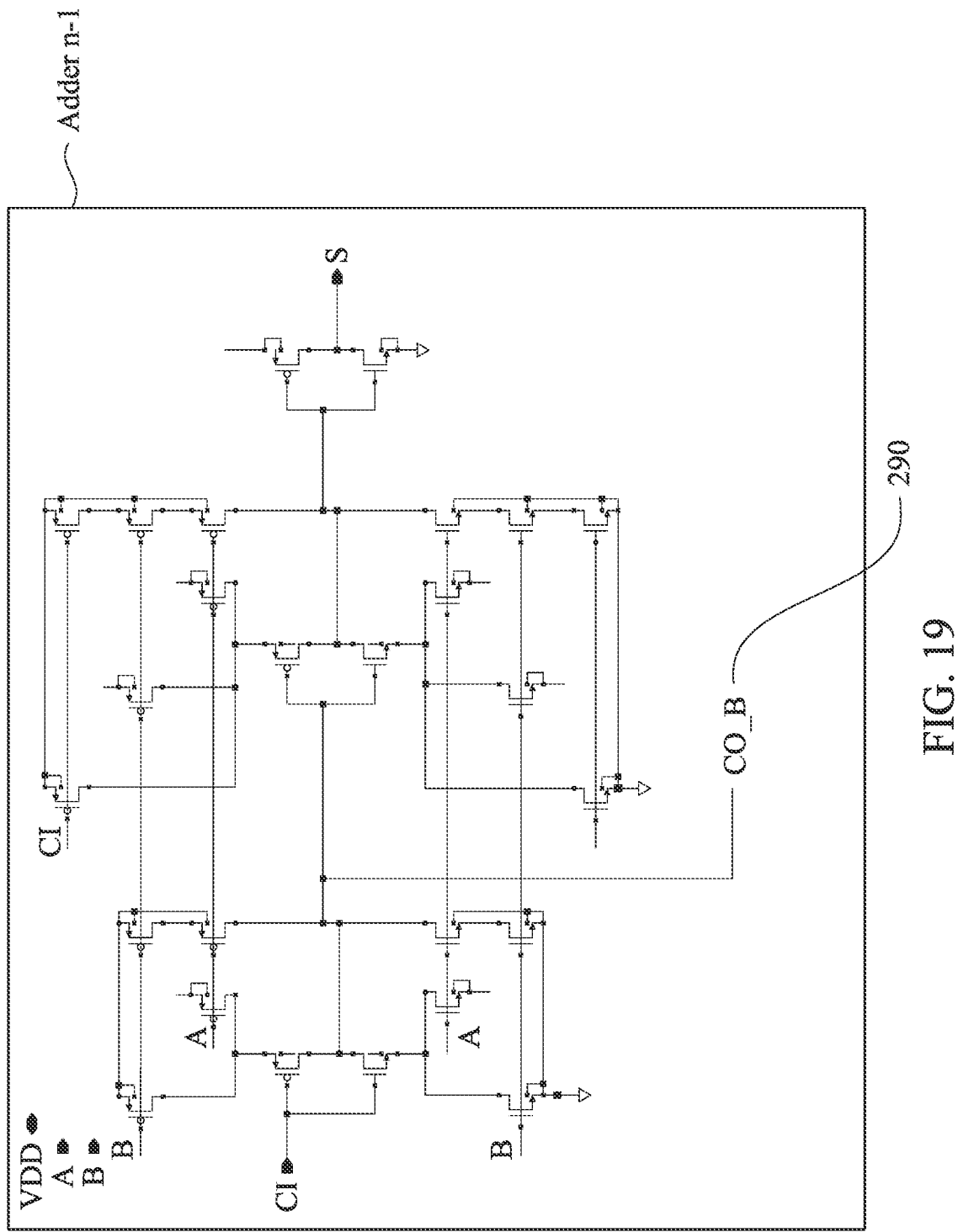
FIG. 19 is a schematic diagram illustrating an example of a modified full adder in accordance with disclosed embodiments.

However, the last full adder, Adder n, receives the inverse of the carry out bit Co from the preceding adder, Adder n−1. FIG. 19 illustrates an example of the Adder n−1, where the inverter 290 is eliminated such that the inverse of the carry out signal is output at the carry output terminal 292, which provides the inverted carry input CiB to the final full adder, Adder n. As discussed previously, an example of the final adder, Adder n, is shown in the simplified adder circuit 280 of FIG. 17.

Figure 20:
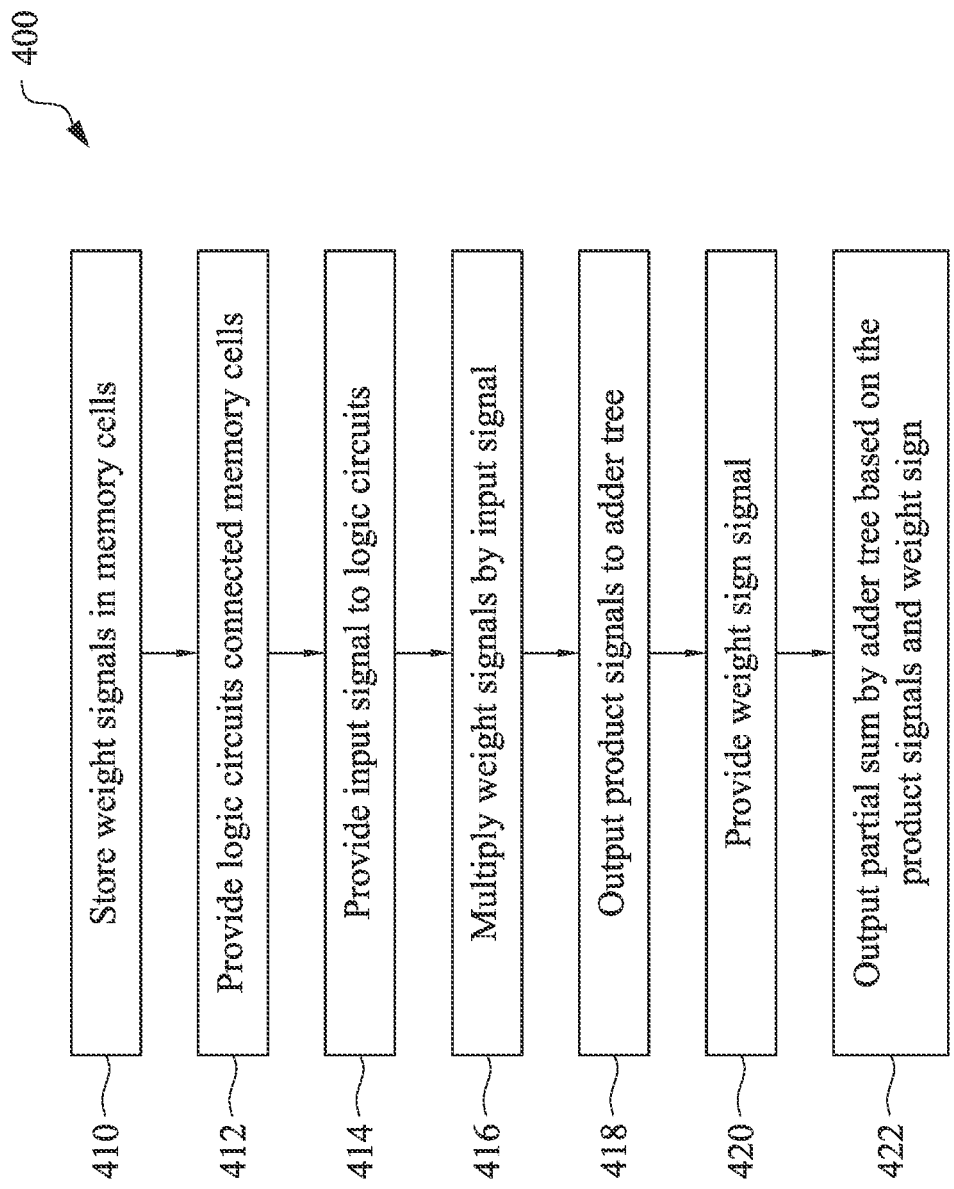
FIG. 20 is a flow diagram illustrating a CIM method in accordance with disclosed embodiments.

FIG. 20 is a flow diagram illustrating an example of a CIM method in accordance with disclosed embodiments. With further reference to FIGS. 7 and 8, the method 400 includes storing a plurality of weight signals W[3:0] in a plurality of memory cells 112 at an operation 410. Each of the memory cells 112 stores one bit of the w-bit weight signals. A plurality of logic circuits 214 are provided in operation 412, which are connected to respective ones of the plurality of memory cells. An input signal $A_I$ is provided to the plurality of logic circuits 214 in operation 414. The logic circuits 214 are configured to multiply the weight signals W[3:0] by the input signal $A_I$ to provide a plurality of product signals at operation 416. At an operation 418, the plurality of product signals are output from the plurality of logic circuits 214 to an adder tree 220. A weight sign signal WS is provided at operation 420. The weight sign signal WS is configured to indicate whether the weight signal is signed or unsigned. At operation 422, a partial sum signal is output by the adder tree 220 based on the product signals and the weight sign signal.

Thus, the present disclosure provides a CIM system that includes memory cells for storing CIM weights, with a multiply circuit coupled to each of the memory cells. The disclosed system is configured to use multi-cycle inputs to multiply input signals with the column-based stored weights. The input signals and/or the weight signals may be signed or unsigned, and the product outputs of the multiply circuits are accumulated by an adder tree and accumulator.

Disclosed embodiments include CIM device having a memory array with a plurality of memory cells arranged in rows and columns. The plurality of memory cells include a first memory cell in a first row and a first column of the memory array and a second memory cell in the first row and a second column of the memory array. The first and second memory cells are configured to store respective first and second weight signals. An input driver is configured to provide a plurality of input signals, and a first logic circuit is coupled to the first memory cell to provide a first output signal based on a first input signal from the input driver and the first weight signal. A second logic circuit is coupled to the second memory cell and provides a second output signal based on a second input signal from the input driver and the second weight signal.

In accordance with further embodiments, a CIM device includes a memory array with a plurality of memory cells arranged in rows and columns. The plurality of memory cells store a weight signal having w bits where w is a positive integer. The memory array has w columns, and each of the memory cells is configured to store one bit of the weight signal. Each of the memory cells are coupled to a corresponding multiply circuit, which is configured to provide a product signal based on a received input signal and the weight signal stored in the corresponding memory cell. An adder circuit is configured to add the product signals and output a partial sum signal.

In accordance with still further embodiments, a CIM method includes storing a plurality of weight signals in a plurality of memory cells, wherein each of the weight signals has w-bits (w is a positive integer). Each of the memory cells stores one bit of the w-bit weight signals. A plurality of logic circuits are connected to respective ones of the plurality of memory cells. An input signal is provided to the plurality of logic circuits to multiply the weight signals by the input signal to provide a plurality of product signals. The plurality of product signals are output from the plurality of logic circuits to an adder tree. A weight sign signal indicates whether the weight signal is signed. A partial sum signal is output by the adder tree based on the product signals and the weight sign signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A compute-in-memory (CIM) device, comprising:
a memory array including a plurality of memory cells arranged in rows and columns, the plurality of memory cells including a first memory cell in a first row and a first column of the memory array and a second memory cell in the first row and a second column of the memory array, the first and second memory cells configured to store respective first and second weight signals;
an input driver configured to provide a plurality of input signals;
a first logic circuit coupled to the first memory cell and configured to provide a first output signal based on a first input signal from the input driver and the first weight signal;
a second logic circuit coupled to the second memory cell and configured to provide a second output signal based on a second input signal from the input driver and the second weight signal; and
an adder circuit configured to add weight sign signals associated with the first and second weight signals.

2. The device of claim 1, wherein the first and second logic circuits each comprise a multiply circuit.

3. The device of claim 2, wherein the multiply circuit comprises a NOR gate.

4. The device of claim 2, wherein the multiply circuit comprises an AND gate.

5. The device of claim 1, wherein the first and second memory cells each comprise an SRAM cell.

6. The device of claim 1, further comprising a register storing a weight sign bit.

7. The device of claim 1, further comprising:
a third memory cell in a second row and the first column of the memory array and a fourth memory cell in the second row and the second column of the memory array, the third and fourth memory cells configured to store respective third and fourth weight signals;
a third logic circuit coupled to the third memory cell and configured to provide a third output signal based on a third input signal from the input driver and the third weight signal; and
a fourth logic circuit coupled to the fourth memory cell and configured to provide a fourth output signal based on a fourth input signal from the input driver and the fourth weight signal.

8. The device of claim 7, wherein the adder circuit is configured to add the first, second, third and fourth output signals.

9. The device of claim 8, wherein the adder circuit is further configured to add weight sign signals associated with the third and fourth weight signals.

10. A compute-in-memory (CIM) device, comprising:
a memory array including a plurality of memory cells arranged in rows and columns, the plurality of memory cells configured to store a weight signal having w bits where w is a positive integer, the memory array including w columns, each of the memory cells configured to store one bit of the weight signal;
a plurality of multiply circuits, each of the memory cells being coupled to a corresponding one of the multiply circuits and configured to provide a product signal based on a received input signal and the weight signal stored in the corresponding memory cell; and
an adder circuit configured to add the product signals and output a partial sum signal, wherein the adder circuit is configured to receive a weight sign corresponding to the weight signals.

11. The device of claim 10, wherein the memory cells storing the w bits of the weight signal are in one row of the memory array.

12. The device of claim 10, wherein the memory cells are configured to store a plurality of the weight signals, and wherein the memory cells storing the w bits of the plurality of the weight signals and the corresponding multiply circuits are in a respective plurality of rows of the memory array.

13. The device of claim 12, wherein the adder circuits are each configured to receive the product signals from two rows of the memory array.

14. The device of claim 13, wherein the adder circuits each include a half adder circuit.

15. The device of claim 14, wherein the adder circuits each include one half adder circuit and a plurality of full adder circuits.

16. The device of claim 10, further comprising an accumulate circuit configured to shift and add the partial sum signal to produce a CIM output.

17. A compute-in-memory (CIM) method, comprising:
storing a plurality of weight signals in a plurality of memory cells, wherein each of the weight signals has w-bits (w is a positive integer), and wherein each of the memory cells stores one bit of the w-bit weight signals;
providing a plurality of logic circuits connected to respective ones of the plurality of memory cells;
providing an input signal to the plurality of logic circuits to multiply the weight signals by the input signal to provide a plurality of product signals;
outputting the plurality of product signals from the plurality of logic circuits to an adder tree;
providing a weight sign signal configured to indicate whether the weight signal is signed; and
outputting a partial sum signal by the adder tree based on the product signals and the weight sign signal.

18. The method of claim 17, further comprising:
shifting and adding the partial sum signal by an accumulator to produce a CIM output.

19. The method of claim 17, wherein the memory cells are arranged in a matrix of rows and columns, wherein the adder tree includes a plurality of adder circuits, and wherein outputting the plurality of product signals from the plurality of logic circuits includes outputting the product signals from adjacent rows to each of the adder circuits.

20. The method of claim 17, further comprising combining a plurality of the w-bit weight signals.

* * * * *